United States Patent [19]

Moog

[11] 4,180,707
[45] Dec. 25, 1979

[54] DISTORTION SOUND EFFECTS CIRCUIT

[75] Inventor: Robert A. Moog, East Aurora, N.Y.

[73] Assignee: Norlin Industries, Inc., Lincolnwood, Ill.

[21] Appl. No.: 808,503

[22] Filed: Jun. 21, 1977

[51] Int. Cl.$^2$ ............................ G10D 5/00; G10H 1/02
[52] U.S. Cl. ..................................... 179/1 M; 84/1.24; 84/1.11
[58] Field of Search ................. 179/1 D, 1 VL, 1 M, 179/1 J; 333/17 L; 84/1.24, 1.11; 328/168; 307/261, 264

[56] References Cited

U.S. PATENT DOCUMENTS

| | | | |
|---|---|---|---|
| 3,229,038 | 1/1966 | Richter | 179/1 D |
| 3,719,782 | 3/1973 | Barnum | 179/1 M |
| 3,808,540 | 4/1974 | Kabrick | 179/1 VL |
| 3,911,776 | 10/1975 | Bergel | 179/1 D |
| 4,021,613 | 5/1977 | Kennedy | 179/1 D |

OTHER PUBLICATIONS

L. Feldman, "Time Delay", Audio, Dec., 1976, p. 44.

Primary Examiner—Malcolm A. Morrison
Assistant Examiner—E. S. Kemeny
Attorney, Agent, or Firm—Ronald J. Kransdorf; Jack Kail

[57] ABSTRACT

A distortion sound effects circuit producing an output signal corresponding to an input signal but containing one of four selected types of distortion. A compressor which includes a voltage-controlled amplifier first compresses the audio input signal within preselected limits, and the distortion operations are performed on the compressed audio signal to advantageously render the subsequent distortion operations insensitive to gross amplitude fluctuations of the input signal. The compressor includes means for full-wave rectifying the compressed audio signal. The full-wave rectified signal is provided as a distorted output signal containing hard-even distortion of the type commonly achieved by severely, asymmetrically clipping a signal. A distortion circuit includes single voltage controlled square-low amplifier to which the compressed audio signal is applied performs the other three types of distortion. Soft-odd distortion is achieved by slightly and symmetrically overloading the input stage of the amplifier by an amount less than would result in clipping at the output stage. Hard-odd distortion is achieved by symmetrically and severely overloading the input of the amplifier to cause clipping at the output stage. Soft-even type distortion is achieved by squaring the compressed audio signal through modulation of the amplifier gain with the compressed audio signal while it is also applied to the amplifier signal input. A mixer having three inputs respectively coupled with potentiometers respectively fed by the amplifier output, the full-wave rectifier output and the undistorted, compressed audio signal output of the compressor circuit enables a musician to mix the three signals in any desired proportion.

24 Claims, 6 Drawing Figures

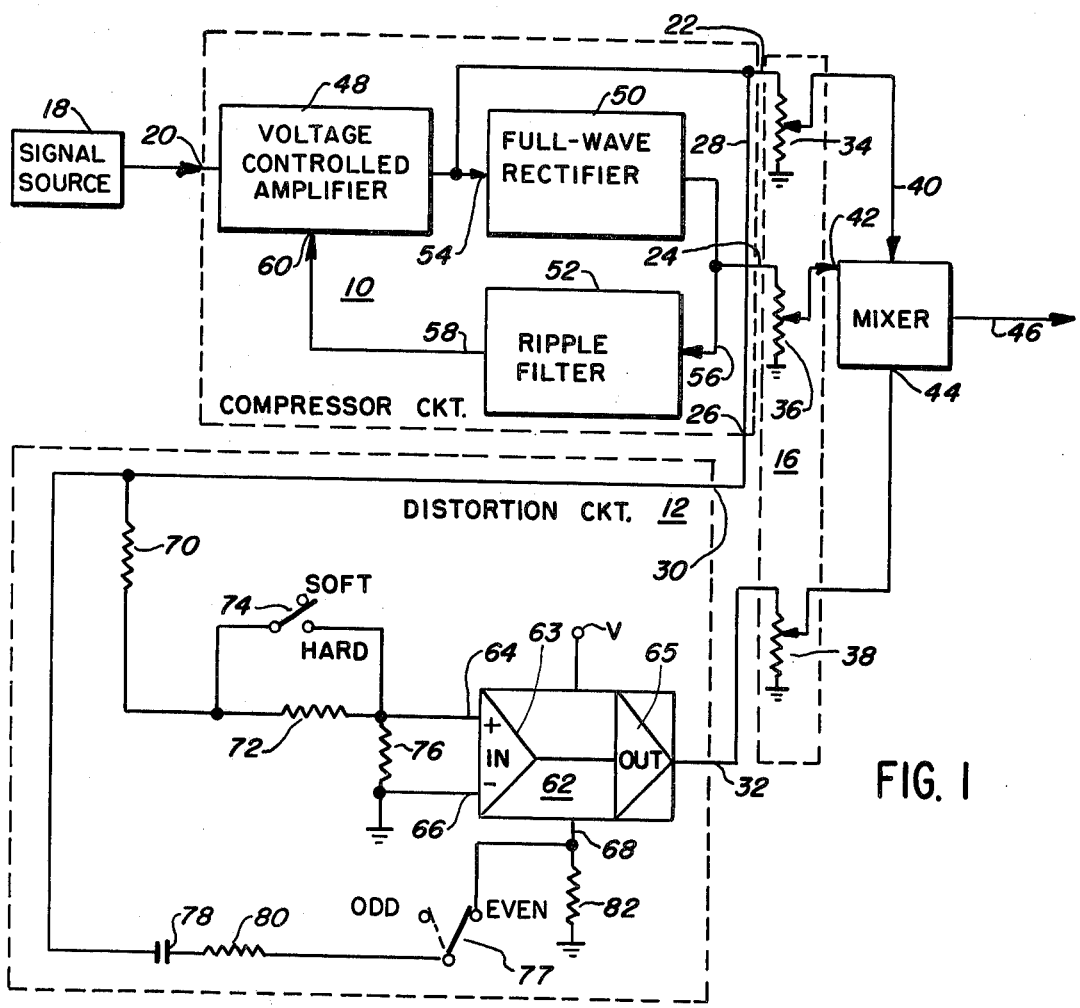
FIG. 1
FIG. 2a — UNDISTORTED INPUT
FIG. 2b — OUTPUT FROM SOFT CLIPPING
FIG. 2c — OUTPUT FROM HARD CLIPPING
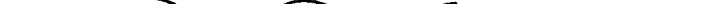
FIG. 2d — OUTPUT FROM SYMMETRICAL CLIPPING
FIG. 2e — OUTPUT FROM ASYMMETRICAL CLIPPING

DISTORTION SOUND EFFECTS CIRCUIT

BACKGROUND OF THE INVENTION

Modern day music is laden with the sounds of various instruments which are electronically amplified and modified in myriad ways to achieve different musical sound effects. One common type of sound effect often used in conjunction with electric guitars and the like is achieved through the introduction of distortion to the electric audio signals produced by the instrument prior to or during final amplification of the signal before conversion to sound. Units which perform these sound modification functions are well known and are commonly referred to as "fuzz boxes".

A well known technique used in such "fuzz boxes" is to introduce additional harmonic content to an audio signal by clipping. Two aspects of clipping are important in establishing the quality and type of additional harmonic content that is obtained: abruptness of clipping and symmetry of clipping. The symmetry of clipping, i.e. the extent to which the positive and negative polarity portions of the audio signal are clipped by the same amount establishes whether the harmonics are odd numbered harmonics or even numbered harmonics. The abruptness of clipping, i.e. whether the signal is severely clipped (hard clipping) or gradually reduced or compressed (soft clipping) determines whether most of the resulting harmonics are high order harmonics or low order harmonics. A graphic representation of these two clipping parameters is shown in FIGS. 2b-2c.

FIG. 2a is an illustration of an undistorted audio input signal for comparison with the waveforms of FIGS. 2b-2e which are illustrations of the waveforms resulting from clipping the undistorted waveform of FIG. 2a in different ways. FIG. 2b illustrates the waveform resulting from "soft" clipping of the signal of FIG. 2a. As will be explained in more detail hereinafter, the distortion circuit 12 performs a soft clipping operation on the signal by slightly overloading an input stage of an amplifier amplifying the undistorted signal. As seen in FIG. 2a, this type of clipping results in the signal to be undistorted within an amplitude range A less than the peak amplitude of the undistorted signal and to be gradually reduced with respect to the undistorted signal beyond this range. Soft clipping results in the development of low order harmonics which results in a sound that is subjectively characterized as being a "mellow" or "warmer" sound. This type of distortion is sometimes referred to as soft distortion. More specifically, the type of distortion introduced by soft clipping generally gives rise to a harmonic series in which the amplitude of a given harmonic dies off faster than the square of the harmonic number. In this type of distortion, there is very little energy, approximately only one or two percent, in harmonics above the fifth harmonic. Alternately, if the energy in the higher order harmonic is more than a few percent of the total sound energy and these higher order harmonics lie in the frequency band between 1 kHz and 5 kHz, the frequency range in which hearing is most sensitive, then the resulting sound has a harsh, strident quality.

Illustrated in FIG. 2c, is the output signal developed from performing a hard clipping operation on the undistorted signal of FIG. 2a. In this type of distortion, the waveform above a preselected amplitude, amplitude C, for instance, is abruptly terminated. The distortion resulting from hard clipping results in a harmonic series that generally dies off in inverse proportion to the harmonic number as is sometimes referred to as hard distortion. For instance, the tenth harmonic will be one half as strong as the fifth harmonic. In a waveform which is severely hard clipped, such that it almost appears as a square wave, the energy in the overtones is greater than the energy in the fundamental frequency, and most of this energy resides in harmonics above the fifth harmonic. The sound produced from a hard clipped audio signal is sometimes subjectively characterized as a "raspy" or "dirty" sound.

FIG. 2d illustrates the output waveform produced from symmetrically clipping the undistorted input waveform of FIG. 2a. FIG. 2e illustrates the output waveform developed from asymmetrically clipping the undistorted input of FIG. 2a. As stated, the clipping symmetry determines the percentage of even harmonics that are present in the distorted waveform. Completely symmetrical clipping, as in FIG. 2d, in which both the positive and negative portions of the waveform are clipped by equal amounts, results in the generation of only odd harmonics. This type of distortion is thus referred to as odd distortion. The sound produced from a signal containing only odd harmonics is sometimes subjectively characterized as having a "hollow" or "woody" quality. The waveform developed by asymmetrically clipping in which the positive portion of the waveform is clipped by a greater or lesser amount than the negative portion of the waveform, as illustrated in FIG. 2e, results in a signal containing even harmonics. If the clipping is completely asymmetrical, then only even harmonics are produced which are octaves of the fundamental frequency and the odd harmonics thereof. This type of distortion is thus referred to as even distortion. Some musicians subjectively characterize the sound developed in response to a signal containing only even harmonics as more "musical".

Heretofore, the distortion characteristics obtained by soft clipping has only been achieved through the use of vacuum tube amplifiers. The use of semiconductors is generally preferred over vacuum tube amplifiers due to the larger size and power requirements of vacuum tubes over semiconductor amplifiers and because of the generally better reliability of semiconductor amplifiers. Thus, while this type of soft clipping distortion can be achieved through the use of vacuum tube amplifiers, because of the reasons noted above and because vacuum tube circuits are not generally compatible with semiconductor circuits which are required for achieving other types of distortion, there is a need for a semiconductor circuit that will achieve these same results.

A common problem with known "fuzz boxes" in which distortion is obtained by clipping arises from the fact that electric guitars or other instruments which produce the input audio signal to the "fuzz boxes" are often provided with a volume control to enable the musician to make level changes to the audio signal. If the clipping level is not changed in the same sense as the input level, changing the input level can result in undesired changes in the type of distortion produced by the "fuzz box". For example, if the clipping level is set to obtain soft clipping type distortion, and the input audio signal amplitude is doubled, hard clipping may result unless the clipping level is proportionately raised. This input gain sensitivity which precludes or limits the musician from maintaining a selected type of distortion while making volume changes at the instrument has therefore been an undesirable feature of known distortion circuits.

A cost disadvantage of known distortion circuits having a multiple distortion capability is that separate circuits have been required for each of the different types of distortion or the circuits could provide only one type of distortion at a time.

SUMMARY OF THE INVENTION

A principal object of the present invention is to provide a distortion sound effects circuit which overcomes the disadvantages of known distortion circuits while providing four different types of distortion with circuitry which is simple in operation, does not require critical adjustments, and which is low in cost.

Another object of the present invention is to provide a distortion special effects circuit which overcomes the input gain sensitivity problem of known circuits noted above. In keeping with this objective, the input audio signal is first compressed by a gain leveling compressor prior to performing the distortion operations thereon in a preferred embodiment of the distortion special effects circuit.

A further object of the present invention is to provide a hard-even type of distortion by full-wave rectifying the audio signal to be distorted and providing said full-wave rectified signal as a final output. It has been found that the full-wave rectified audio signal contains a higher percentage of high order harmonics than that obtained by conventional asymmetrical clipping techniques.

Yet another object is to provide a distortion sound effects circuit in which three different types of distortion (hard-odd, soft-odd and soft-even) are obtained through operation of a single voltage controlled amplifier.

Still a further object of the present invention is to provide a distortion sound effects circuit in which soft-even type distortion comparable to the distortion obtained from a vacuum tube amplifier is obtained through operation of a semiconductor amplifier.

Yet a further object of the invention is to provide a distortion special effects circuit in which a soft-odd type of distortion is obtained, not by asymmetrical soft clipping, but by arithmetically squaring the audio signal.

BRIEF DESCRIPTION OF THE DRAWING

The foregoing features and advantages will be made more apparent and further features and advantages of the present invention will be disclosed in the description of the preferred embodiment which will be given with reference to the several views of the drawing, in which:

FIG. 1 is a circuit schematic, partially in functional block form, of one embodiment of the distortion sound effects circuit of the present invention;

FIG. 2a is an illustration of an undistorted, sinusoidal input signal for comparison with the waveforms of FIGS. 2b-2e;

FIG. 2b is an illustration of the type of output waveform developed from soft clipping the waveform of FIG. 2a;

FIG. 2c is an illustration of the type of output waveform developed from hard clipping the waveform of FIG. 2a;

FIG. 2d is an illustration of the type of output waveform signal developed from symmetrically clipping the waveform of FIG. 2a; and FIG. 2e is an illustration of the type of output waveform developed from asymmetrically clipping the waveform of FIG. 2a.

DESCRIPTION OF THE PREFERRED EMBODIMENT

Referring to FIG. 1, one embodiment of the distortion sound effects circuit of the present invention is seen to comprise a compressor circuit 10, a distortion circuit 12, a mixer 14 and a level control circuit 16. Audio signals from a signal source 18, such as an electric guitar pickup, are applied to an input 20 of compressor circuit 10. Compressor circuit 10 amplifies the audio signal by an amount which varies inversely with the amplitude of the input audio signal to produce an amplitude limited or compressed audio signal on its output 22 corresponding to the input audio signal. An amount of compression imparted by compressor circuit 10 such that the signal produced on output 22 remains within 10 db as the input audio signal varies in level between +10 dBm and −50 dBm has been found suitable. The compressor circuit 10 also produces a signal on its output 24 which is proportional to the compressed signal developed on output 22 but which is full-wave rectified. The compressed audio signal on output 22 is also coupled to an output 26 via a line 28 and coupled to an input 30 of distortion circuit 12. Distortion circuit 12 introduces a selected one of three types of distortion to the compressed audio input signal and provides a distorted signal on its output 32. The signals produced on outputs 22 and 24 of compressor circuit 10 and on output 32 of distortion circuit 12 are respectively coupled to potentiometer resistors 34, 36 and 38 of level control circuit 16. The wiper outputs of potentiometers 34, 36 and 38 are respectively coupled to inputs 40, 42 and 44 of mixer 14. Mixer 14 combines the three signals together to form a composite distorted audio signal on an output 46 thereof. Potentiometers 34, 36 and 38 enables an operator to selectively vary the proportion of each input signal applied to mixer 14 and thus to vary the content of the composite output signal.

The compressor circuit 10 operates in a conventional manner and comprises a voltage controlled amplifier 48 for amplifying the input signal applied to input 20, a full-wave rectifier 50 and a ripple filter 52. The voltage controlled amplifier may comprise any one of a number of commercially available integrated circuits. The output signal of the voltage controlled amplifier is applied to an input 54 of full-wave rectifier 50 which full-wave rectifies the input signal and applies it to output 24. The full-wave rectified signal produced on output 24 is also applied to an input 56 of ripple filter 52. The ripple filter 52 minimizes the oscillating component of the full-wave rectified signal to produce a D.C. gain control signal on its output 58.

The gain control signal is applied to a gain control input 60 of voltage controlled amplifier 48, the gain of which varies accordingly. As the level of the audio signal applied to input 20 increases, the magnitude of the signal applied to gain control input 60 varies proportionately to reduce the gain of voltage controlled amplifier 48. Likewise, as the level of the audio signal applied to input 20 decreases, the amplitude of the gain control signal applied to input 60 varies to increase the gain. In this fashion, the amplitude fluctuations of undistorted audio signal produced on outputs 22 and 26 as well as those of the full-rectified audio signal produced on output 24 are maintained within the selected 10 db limit despite level changes between +10 dBm and −50 dBm of the audio signal applied to input 20. The subsequent distortion operations are performed on the compressed audio signal and are therefore advantageously, relatively insensitive to the level of the audio input signal at input 20.

The distortion special effects circuit produces four types of distortion which are combinations of the distortion types discussed above: soft-odd, soft-even, hard-odd and hard-even. The hard-even type distortion is simply obtained by providing the compressed, full-wave rectified signal from full-wave rectifier 50 as an input to mixer 14 from where it may be directly passed through to output 46. The other types of distortion are developed by operations of the distortion circuit 12 on the compressed, undistorted audio signal at input 30 thereof as described below.

The distortion circuit 12 produces soft-odd, soft-even and hard-odd distortion. These different types of distortion are achieved by coupling appropriate signals to the input of a voltage controlled amplifier or VCA 62. Any number of commercially available integrated amplifier circuits can be used for VCA 62, such as the Operational Transconductance Amplifier Integrated Circuit, Type No. CA3080, made by RCA and described at page 364 et seq of the 1972 edition of their solid state data-book, SSD-201, entitled "Linear Integrated Circuits and MOS Devices". Accordingly, the details of the amplifier do not form a part of the present invention and, for the sake of brevity, will not be described herein. A circuit made in accordance with the schematic of FIG. 1 and employing the RCA CA3080 operational amplifier for VCA 62 was constructed and performed satisfactorily. It should, however, be appreciated that other commercially available circuits could be employed in its place which have comparable circuit characteristics.

The VCA 62 has two signal inputs 64 and 66 and an output comprising output 32 of distortion circuit 12. In addition, the gain of voltage controlled amplifier 62 is controlled in accordance with the magnitude of a signal at a gain control input 68. Input 66 is connected with a reference potential, such as ground. Input 64 is connected with input 30 of distortion circuit 12 through a resistor 70 and a resistor 72 or a selection switch 74 connected in parallel with resistor 72. A third resistor 76 connected between ground and the junction of input 64 and resistor 72 forms a voltage divider with resistor 70 when switch 74 is closed and forms a voltage divider with both resistors 70 and 72 when switch 74 is open, as shown. VCA 62 is powered by a DC voltage source V which establishes the maximum level of the output signal produceable by the amplifier. Thus, the compressed, undistorted, audio signal at input 30 of distortion circuit 12 is attenuated by one amount when switch 74 is in its open position, as shown, and is attenuated by a lesser amount when switch 74 is closed.

Soft type distortion is obtained when switch 74 is open and hard type distortion is obtained when switch 74 is closed. An important characteristic of VCA 62 with respect to obtaining soft type distortion is that it has a "gentle" overload characteristic similar to those of vacuum tube amplifiers. Unlike many operational amplifiers, the RCA CA3080, for instance, has a relatively low gain. This low gain enables soft distortion to be introduced by overloading its input stage 63 without resulting in hard clipping at the output stage 65. Many operational amplifiers, on the other hand, have such a high gain that it is virtually impossible to overload the input stage before the output signal is abruptly clipped at the level of the power supply voltage.

The relative magnitudes of resistors 70, 72 and 76 are selected with respect to the magnitude range of the compressed, undistorted audio signal and the overload characteristics of VCA 62, so that when switch 74 is open, the level of compressed audio signal applied to input 64 is great enough to slightly overload the input stage of VCA 62 to obtain soft distortion. The relative magnitudes of these resistors are likewise selected, so that the level of the compressed audio signal applied to input 64 is low enough to avoid hard clipping at the output stage at the level of the DC voltage source V. The relative magnitudes of resistors 70 and 76 are also likewise selected, so that the signal applied to input 64 is sufficiently high to heavily overload VCA 62 when switch 74 is closed to obtain hard clipping type distortion.

Selection of odd or even distortion is achieved through operation of selection switch 77. With switch 77 closed, the undistorted audio signal applied to input 30 of distortion circuit 12 is coupled through a capacitor 78 and a resistor 80 to gain control input 68 to achieve even type distortion. A resistor 82 coupled between input 68 and ground provides ground bias to input 68 when switch 77 is opened and forms a voltage divider with resistor 80 when switch 77 is closed. The signal applied to input 66 is therefore proportional to the audio signal at input 64, and gain of VCA 62 is thereby modulated accordingly. This results in the signal produced on output 32 to be proportional to the arithmetic square of the undistorted, compressed, audio signal applied to input 64. This gives rise to the desired second order distortion in the output signal containing primarily the second harmonic and octaves of the odd harmonics of the fundamental.

With switch 77 in its open or odd position, the gain of voltage controlled amplifier 62 remains fixed, and the audio signal applied to input 64 is symmetrically distorted. The symmetrical or odd type distortion is also either of the hard or soft type depending upon the position of the switch 74.

Thus, it is seen that with switch 77 in the open position, soft-odd type distortion is obtained when switch 74 is opened and hard-odd distortion is achieved when switch 74 is closed. Likewise, with switch 77 in the closed position, as shown, soft-even type distortion is obtained when switch 74 is in the open position, as shown. Hard-even type distortion is not achieved through closure of both switches 74 and 77, but rather is achieved by providing the full-wave rectified signal on compressor output 24 as an input to mixer 14.

Finally, it should be appreciated that myriad combinations of the selectable types of distortion can also be obtained by mixing the three signals applied to mixer 14 in different proportions. Wave cancellation and summation occurring in the mixer when the signals are combined therein may result in other types of distortion which are hybrids of the types described above.

I claim:

1. A distortion sound effects circuit for introducing distortion to an audio signal applied to an input terminal thereof, comprising:

a low-gain semiconductor amplifier having an input and an output, the output from said amplifier not exceeding a predetermined maximum amplitude output level regardless of the input applied to the amplifier;

means for generating a modified signal, the amplitude of which is proportional to said audio input signal;

a distortion control circuit, said modified signal being applied through said distortion control circuit to the input of said amplifier;

said means for generating a modified signal and said distortion control circuit being normally operative, over the full amplitude range of the audio signal, to maintain the amplitude of the input signal to the amplifier at a level high enough to slightly overload the amplifier, but not high enough to cause the amplifier to clip its output at the amplifier's maximum amplitude output level;

whereby soft type distortion is obtained from the circuit.

2. The distortion sound effects circuit of claim 1 in which said means for generating a modified signal comprises a gain leveling compressor, said compressor producing a level selected signal corresponding to the audio input signal, said compressor limiting the relative amplitude fluctuations of the level selected signal within preselected limits.

3. The distortion sound effects circuit of claim 2 in which said compressor includes a voltage controlled amplifier with an input connected with the input terminal for receiving the audio input signal, and an output on which the level selected signal is produced; and means for controlling the gain of the voltage controlled amplifier in accordance with the level of the audio input signal applied thereto including means for full-wave rectifying the level selected signal to produce a full-wave rectified signal, and means responsive to the full-wave rectified signal for providing an output signal proportional thereto having hard-even type distortion with respect to the audio input signal.

4. The distortion sound effects circuit of claim 3 including means for selectively mixing the level selected signal with the full-wave rectified signal to form a composite output signal.

5. The distortion sound effects circuit of claim 4 in which said mixing means includes means for selectively mixing the softly distorted audio output signal with the level selected signal and the full-wave rectified signal to form a composite output signal.

6. The distortion sound effects circuit of claim 3 including means for mixing the full-wave rectified signal with the softly distorted audio output signal to form a composite output signal.

7. The distortion sound effects circuit of claim 1 including means for selectively increasing the amplitude of the signal applied to the input of the amplifier by an amount great enough to cause the amplifier to clip its output signal at the said maximum amplitude output level, said clipped output signal having hard-off type of distortion with respect to the audio input signal.

8. The distortion sound effects circuit of claim 7 in which said means for generating a modified signal includes means for full-wave rectifying the modified signal, and including mixing means for mixing the full-wave rectified signal with the signal being provided on the output of the semiconductor amplifier.

9. The distortion sound effects circuit of claim 8 in which said mixing means includes means for selectively mixing the modified signal with the semiconductor amplifier output signal and the full-wave rectified signal.

10. The distortion sound effects circuit of claim 9 including means adapted for manually varying the relative proportions of the signals which are mixed by said mixing means.

11. The distortion sound effects circuit of claim 1 in which said semiconductor amplifier is a voltage controlled amplifier having a gain control input, and in which means are provided for developing a gain control signal proportional to the modified signal and means for applying the gain control signal to the gain control input, said gain varying proportionately with variations in the modified signal to cause the voltage controlled amplifier to produce an output signal proportional to the arithmetic square of the modified signal, said arithmetic square proportional signal having soft-even type of distortion with respect to the audio input signal.

12. The distortion sound effects circuit of claim 11 including means for selectively mixing the modified signal with the arithmetic square proportional signal to form a composite output signal.

13. A sound effects circuit for producing a distorted version of an input audio signal, comprising:

means for compressing the input audio signal;

a voltage controlled semiconductor amplifier having a signal input, an output and a gain control input; and means for applying a first signal proportional to the output of said compressing means to said signal input and a second signal proportional to the output of said compressing means to said gain control input;

said voltage controlled amplifier having a variable gain which changes proportionately with changes in amplitude of said second signal to produce an amplified output proportional to the arithmetic square of the audio input signal, said output signal containing a substantial portion of its total energy in low order even harmonics of the fundamental frequencies of the input audio signal.

14. The sound effects circuit of claim 13 in which said output signal containes soft-even type distortion with respect to the input audio signal.

15. The sound effects circuit of claim 13 in which said proportional signal applying means includes means for disconnecting the proportional signal from the gain control input, and said input audio signal applying means includes means adapted for manually changing the magnitude of the input audio signal at the signal input between a first level and a second level less than said first level, said voltage controlled amplifier introducing soft-odd type distortion to the output signal in response to the input audio signal being applied to its input at said second level and introducing hard-odd type distortion to the output signal when the input audio signal is applied to its signal input at said first level.

16. The sound effects circuit of claim 15 in which said voltage controlled amplifier has an input stage and said input stage is slightly overloaded to introduce said soft-odd type distortion when the input audio signal is applied to the signal input at said second level.

17. The sound effects circuit of claim 15 in which the voltage controlled amplifier is severely overloaded and clips the output signal to introduce hard-odd type distortion thereto in response to the input audio signal being applied to the signal input at said first level.

18. A sound effects circuit for introducing distortion to an input audio signal, comprising:
- a compressor responsive to the input audio signal for producing a compressed audio signal corresponding thereto but having amplitude fluctuations limited within preselected levels; and
- a distortion circuit responsive to the compressed audio signal for producing a distorted audio signal corresponding thereto.

19. The sound effects circuit of claim 18 in which said compressor includes means for full-wave rectifying the compressed audio signal and said distortion circuit includes means for producing a distorted audio signal proportional thereto, said distorted audio signal having hard-even type distortion with respect to the input audio signal.

20. The sound effects circuit of claim 19 including means for selectively mixing the full-wave rectified signal with the compressed audio signal to form a composite output signal.

21. The sound effects circuit of claim 18 in which said distortion circuit includes an amplifier having an input, means for coupling the compressed audio signal to the input and an output, said amplifier producing a distorted audio signal on its output in response to said compressed audio signal.

22. The sound effects circuit of claim 21 in which said amplifier has an input stage and an output stage, and said applying means includes means for applying the compressed audio signal to the input stage at a level such that the input stage is slightly overloaded causing it to introduce soft-odd type distortion to the output signal.

23. The sound effects circuit of claim 21 in which said applying means includes means for applying said compressed audio signal to said amplifier at a level causing it to clip the output signal corresponding thereto, said output signal containing hard-odd type distortion with respect to the input audio signal.

24. The sound effects circuit of claim 21 in which said amplifier is a voltage controlled amplifier having a gain control input, and said applying means includes means for applying the compressed audio signal to said gain control input, said amplifier producing the distorted audio signal in response thereto which is proportional to the arithmetic square of the input audio signal.

* * * * *